United States Patent [19]

Nonaka et al.

[11] 4,200,879
[45] Apr. 29, 1980

[54] INTEGRATED SEMICONDUCTOR DEVICE INCLUDING STATIC INDUCTION TRANSISTOR

[75] Inventors: Terumoto Nonaka; Tadahiko Hotta; Shin Yamashita, all of Hamamatsu, Japan

[73] Assignee: Nippon Gakki Seizo Kabushiki Kaisha, Hamamatsu, Japan

[21] Appl. No.: 954,917

[22] Filed: Oct. 26, 1978

[30] Foreign Application Priority Data

Nov. 5, 1977 [JP] Japan .................... 52/132756

[51] Int. Cl.$^2$ .................................. H01L 27/04
[52] U.S. Cl. .................................. 357/43; 357/20; 357/22; 357/46; 357/92
[58] Field of Search .............. 357/22, 20, 43, 46, 357/92

[56] References Cited

U.S. PATENT DOCUMENTS

| | | | |
|---|---|---|---|
| 3,295,030 | 12/1966 | Allison | 357/22 |
| 3,453,507 | 7/1969 | Archer | 307/311 |
| 3,721,839 | 3/1973 | Shannon | 357/30 |
| 3,947,707 | 3/1976 | Shannon et al. | 357/22 |

FOREIGN PATENT DOCUMENTS 2730373  1/1978  Fed. Rep. of Germany ............ 357/92

Primary Examiner—William D. Larkins
Attorney, Agent, or Firm—Cushman, Darby & Cushman

[57] ABSTRACT

In an integrated semiconductor device of the IIL type which includes a switching transistor and an injector transistor for supplying carriers to drive the switching transistor, the switching transistor is a static induction transistor which comprises: cylindrical current channels for providing current paths between a source and drains; a control gate surrounding the outer boundaries of the channels to form pn junctions therebetween and being injected with carriers from the injector transistor to control the current flow in the channels; and floating gates disposed inside the respective channels to form pn junctions therebetween. The floating gates are electrically floating and have a potential affected by the potential of the control gate to contribute to the channel conduction controlling action together with the control gate.

6 Claims, 3 Drawing Figures

INTEGRATED SEMICONDUCTOR DEVICE INCLUDING STATIC INDUCTION TRANSISTOR

BACKGROUND OF THE INVENTION (a) Field of the invention

The present invention relates generally to an integrated semiconductor device, and especially it pertains to an integrated semiconductor device of the IIL type wherein a static induction transistor is used as the switching transistor.

(b) Description of the prior art

Among known integrated semiconductor devices of the IIL (Integrated Injection Logic) type, SITL (Static Induction Transistor Logic) devices are a unique and attractive version wherein a static induction transistor (hereinafter to be abbreviated as SIT) of a normally-off mode is used for the driver or switching transistor. The SITL device features excellent operation characteristic, straghtforward simple manufacturing process and high inregration density, which is due mainly to the use of the SIT.

The SIT of a normally-off mode employed in the known SITL device is formed with current channels sorrounded by a gate which constitutes pn junctions with the channels. When no gate bias voltage is applied, the channels are substantially pinched off by depletion layers extending from the gate, and therefore the SIT is in the non-conducting state. With a forward gate bias voltage applied to the gate, however, the depletion layers are caused to shrink to turn the channels conductive. In general, the operation speed and the capability of funouts of the entire SITL device are essentially limited by and subject to the operation performance of the SIT employed. Namely, the operation characteristics of the SITL device can be improved by employing an improved SIT that can provide a higher current gain which is the drain current divided by the gate current, a higher transconductance and a higher switching speed.

SUMMARY OF THE INVENTION

It is, therefore, a primary object of the present invention to provide an improved SITL device which is capable of providing a higher operating speed and/or an increased number of fun-outs.

Another object of the present invention is to provide an SITL device of the type described above, which is easy to manufacture.

Still another object of the present invention is to provide an SITL device of the type described above, which allows high density integration.

In accordance with the present invention, there is provided an SITL device in which: the switching transistor of the device is an improved SIT which comprises: a semiconductor body of a first conductivity type; at least one first gate of a second conductivity type opposite to the first conductivity type and disposed within the semiconductor body; at least one second gate of the second conductivity type and being surrounded by the first gate; at least one current channel comprising a portion of the semiconductor body defined between the first and second gates; at least one drain of the first conductivity type and disposed at one end of the channel; and at least one source of the first conductivity type and disposed at the opposite end of the channel, and in which: the first gate of the switching transistor is injected with carriers from the injector transistor of the device to drive the switching transistor.

Accordingly, it is a further object of the present invention to provide an improved SIT which has a high current gain, transconductance, and switching speed.

These and other objects as well as the features and the advantages of the present invention will be apparent from the following detailed description of the preferred embodiment when taken in conjunction with the accompanying drawings.

DETAILED DESCRIPTION OF THE PREFERRED EMBODIMENT

Figure 1:
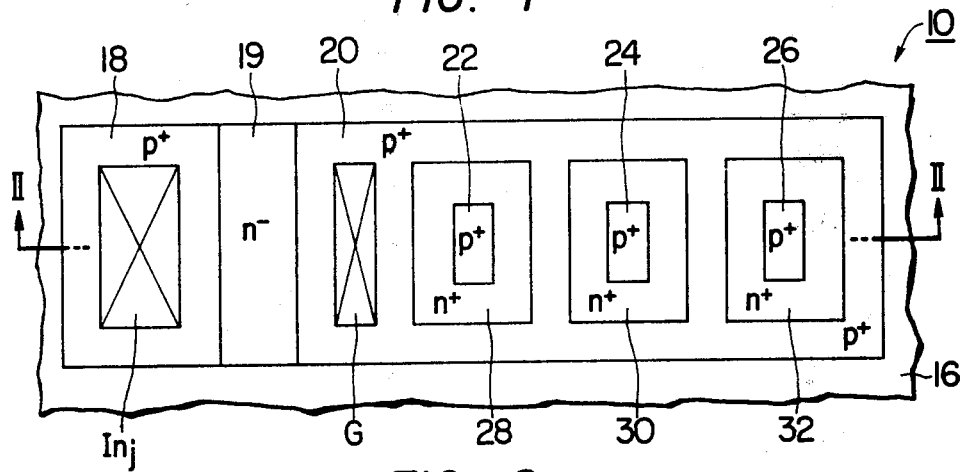
FIG. 1 is a diagrammatic top plan view showing an example of an SITL device embodying the present invention.
Figure 2:
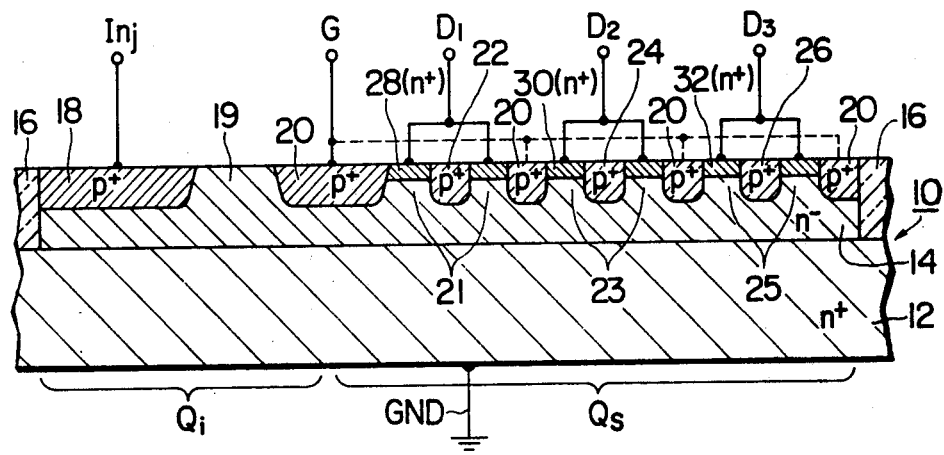
FIG. 2 is a diagrammatic vertical sectional view taken along line II—II of FIG. 1.

An example of an SITL device embodying the present invention is shown diagrammatically in top view in FIG. 1, and its vertical section taken along the line II—II in FIG. 1 is shown in FIG. 2.

The device comprises a semiconductor wafer 10 which is formed with a heavily doped n+ type semiconductor substrat 12 and a relatively-lightly doped n− type semiconductor layer 14 disposed on the substrate. The n− type semiconductor layer 14 may be formed on, for example, by the conventional chemical vapor deposition technique. The layer 14 is electrically divided into isolated islet regions whose outermost boundaries are defined by an isolation grid 16 which extends from the upper surface to the bottom surface of the layer 14. The isolation grid 16 may comprise a p-type diffusion region or an oxide such as silicon dioxide. It should be noted that only one of such isolated islet regions (hereinafter to be indicated by reference numeral 14) is illustrated in FIGS. 1 and 2. In each islet region 14, there is formed one circuit cell which includes a switching transistor and an injector transistor for supplying carriers to drive the former transistor, as will be explained below.

In the islet region 14, there are provided heavily doped p+ type semiconductor regions 18, 20, 22, 24 and 26 all of which are disposed in the vicinity of the upper surface of the islet region 14, and formed in such plan patterns as shown in FIG. 1. These p+ type semiconductor regions may be formed at a time by relying on the known selective diffusion process. The embodiment device further comprises heavily doped n+ type semiconductor regions 28, 30 and 32 which are disposed in the upper portions of those areas of the layer 14 which are sandwiched between the respective regions 20, 22, 24 and 26. These n+ regions may also be formed by the known selective diffusion method.

The p+ region 18, an n− region 19 located between the regions 18 and 20, and the p+ region 20 serve as the emitter, the base and the collector, respectively, of a pnp-type bipolar tansistor having a lateral structure. This bipolar transistor, indicated generally at reference $Q_i$, is to be operated as the injector transistor (or a constant current load) in the SITL device circuit cell. The p+ region 20 of a grid-like shape, the p+ regions 22, 24 and 26, the n+ regions 28, 30 and 32, the n+ substrate 12, and those cylindrical n− regions 21, 23 and 25 in the layer 14 which are sandwiched between the p+ regions 22, 24 and 26 and the p+ region 20 function as the control gate, the floating gates, the drains, the source and the current channels of a static induction transistor of a vertical structure and a normally-off mode. This SIT, indicated generally at reference $Q_s$, is used as the switching transistor (or driver transistor) in the SITL device. It should be understood that the collector of the injector transistor is merged into the p+ control gate 20 of the switching transistor. In general, the source 12 and the drains 28, 30 and 32 are inherently exchangeable.

The base 19 of the injector transistor and the source 12 of the switching transistor are electrically intercoupled together through the n⁻ layer 14, and are grounded via a grounding electrode GND provided on the source 12 for the operation of the SITL device. This ground electrode GND is used concurrently as the source electrode, i.e., the first current-carrying electrode, of the switching transistor. On the emitter 18, there is provided an ohmic electrode Inj to provide an injection electrode, i.e., the emitter electrode, of the injector transistor. In operation, a constant voltage is applied at the injection electrode Inj. The switching transistor has, at its control gate 20, an ohmic electrode G to serve as the current control electrode to which a control signal may be externally applied for controlling the operation of the switching transistor. Whereas, the floating gates 22, 24 and 26 are provided with no electrode, because they are intended to be used in floating fashion without any external signal applied thereto. To the respective drains 28, 30 and 32 are provided ohmic electrodes $D_1$, $D_2$ and $D_3$ which are the second current-carrying electrodes of the switching transistor.

The geometrical dimensions and the impurity concentrations of the semiconductor regions for constituting the switching transistor, i.e., a static induction transistor, are determined so as to insure that this transistor will operate in a normally-off mode. More particularly, they are set so that when the control gate 20 is held at substantially zero potential relative to the source 12, the current channels 21, 23 and 25 are almost completely pinched off by the depletion layers which are developed around the control gate 20 and the floating gates 22, 24 and 26 due to only the diffusion potential between the current channels and the gates, and that thus the switching transistor is maintained non-conductive. When the control gate 20 attains a positive potential of 0.3~0.8 volt or more relative to the source 12, the gate depletion layers will shrink to such an extent as will render the current channels 21, 23 and 25, and therefore the switching transistor will be turned "on".

Preferable dimensions and impurity concentrations of the respective parts of the semiconductor device embodying the present invention will described hereunder. In the embodiment of FIG. 2, the substrate region has an impurity concentration of $10^{24} \sim 10^{27}$ atoms/m³. The n⁻ region 14 has a thickness of 2~10μm and an impurity concentration of $10^{18} \sim 10^{21}$ atoms/m³. The injection region 18, the control region 20 and the floating gates 22, 24 and 26 have a depth of 1~3μm and an impurity concentration of $10^{24} \sim 10^{26}$ atoms/m³. The drains 28, 30 and 32 have a depth of 1μm or less and an impurity concentration of $10^{24} \sim 10^{27}$ atoms/m³. The portion of the region 14 sandwiched between the regions 18 and 20, that is the portion 19, has a thickness (horizontal direction in FIG. 2) of about 5μm or less to be the base of the pnp transistor. The distance between the control gate 20 and the floating gates 22, 24 and 26 is 2~10μm to define the channel width of the switching transistor.

As each of the channels 21, 23 and 25, which is the portion of the region 14 existing between the control gate 20 and the floating gates 22, 24 and 26, is of a high resistivity n⁻ semiconductor having an impurity concentration of $10^{18} \sim 10^{21}$ atoms/m³, the depletion layers extend greatly from the control gate and the floading gates (p-n junction) to substantially close or pinch-off the channel at zero gate voltage, and shrink to open the channel when the gate potential is raised.

Figure 3:
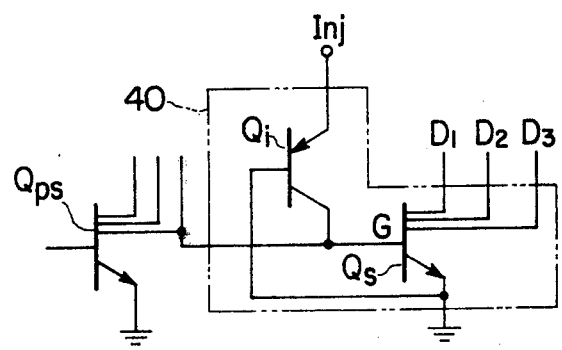
FIG. 3 is a chart showing an equivalent circuit of the embodiment shown in FIGS. 1 and 2.

An equivalent circuit of the SITL device shown in FIGS. 1 and 2 is illustrated in FIG. 3, wherein one circuit cell formed in each islet region 14 on the semiconductor wafer 10 is enclosed in a dashed box 40. In this Figure, reference symbol $Q_{ps}$ indicates the switching transistor in the preceding stage, i.e., another circuit cell, in the SITL device.

Referring now to FIGS. 1, 2 and 3, the logical operation of the embodiment SITL device will be explained below. Let us suppose that the injection electrode is held at a positive constant potential and that the switching transistor $Q_{ps}$ in the preceding stage is turned "on". Under this condition, almost all of the carriers (positive holes) supplied from the collector 20 of the injector transistor $Q_i$ are drawn into the drain of the preceding transistor $Q_{ps}$, and the control gate 20 of the switching transistor $Q_s$ is held at a low level potential, i.e., almost ground potential. Thus, the switching transistor $Q_s$ is in the non-conducting state, with its drains being at a high level potential. It should be understood that it is the usual case that either one of the drains of the transistor $Q_s$ is connected via a load element to a positive potential, and this load element may be the injector transistor in the subsequent circuit stage not shown. Thereafter, if the preceding transistor $Q_{ps}$ is turned "off", the carriers from the injector transistor $Q_i$ are switched to flow into the control gate 20 of the switching transistor $Q_s$, positively charging the control gate 20 up to a high level potential of 0.8~0.3 volt or more. As a result, the switching transistor $Q_s$ is turned "on" and presents a low level potential at the drains. In short, the circuit cell 40 functions as a NOT logic circuit.

As will be seen in FIGS. 1 and 2, a unique gate structure is introduced into the switching SIT $Q_s$ in the SITL device of the present invention. This gate structure will contribute to improving the SITL device in such respects as operation characteristics, manufacturing process and packing density, as will hereunder be explained in detail.

As the control gate 20 is swung positively, the pn junctions between the control gate 20 and the current channels 21, 23 and 25 are forwardly-biased. Hence, carriers which are positive holes in the instant embodiment are injected into the current channels 21, 23 and 25 from the control gate 20, with the depletion layers which are located around the control gate being caused to shrink. At this moment, the injected carriers partially flow into the floating gates 22, 24 and 26 for positively charging these floating gates in a manner similar to that in which the carriers injected from the emitter 18 reach the collector/gate 20 through the base 19. Thus, the depletion layers which have grown around the floating gates will shrink also to an extent corresponding to the rise in the potential thereof, which, in turn, will accelerate the transition of the current channels to the conducting state. Owing to this action of the floating gates, the switching transistor $Q_s$ can perform switching action at an increased speed. Also, it requires only a small swing of the control-gate potential to turn "on" and attains an increased transconductance. Furthermore, the switching transistor $Q_s$, when in the conducting state, is able to let an increased drain current to flow as compared with an SIT of the prior art used in the SITL device, on account of the reason that the current channels are subjected to conduction modulation by carriers injected from the floaing gates as well as by those carriers from the control gate. As such, the switching transistor $Q_s$ or an SIT according to the present invention is able to attain an increased current gain, and allows a greater number of funouts to be taken. This feature will be useful also for the switching transistor $Q_s$ in rapidly switching a subsequent stage circuit. As mentioned above, the split-gate structure such that the gate is split into a control gate and floating gates, leads to an improved switching transistor (SIT) and accordingly to an improvement in operation characteristic of the SITL device.

In addition, the split-gate structure of the switching transistor in the SITL device according to the present invention is arranged so that the control gate surrounds the outermost boundaries of the current channels and that the floating gates are disposed inside the current channels. This arrangement is very important in increasing the integration density of the device and also in simplifying the manufacutring process.

In the description made above, the static induction transistor according to the present invention is embodied in an SITL device. However, the static induction transistor of the present invention may be successfully used also as a discrete device and further in any other type of integrated semiconductor circuit device. Futhermore, the static induction transistor of the present invention can be constructed so as to have a single current channel. However, the multi-channel design as shown previousely is generally advantageous in logic circuits and in high-power applications. Furthermore, the static induction transistor of the present invention may be modified so that it has an arrangement of current channels whose cross-sectional shape is, for example, octagonal or circular other than the rectangular shape mentioned in the previous embodiment.

What is claimed is:

1. In an integrated semiconductor device of the injection logic type comprising:
   a semiconductor body of a first conductivity type;
   a first transistor having at least one sourcedrain path to serve as a first current channel formed by a portion of said semiconductor body and by a first gate of a second conductivity type opposite to said first conductivity type and adjoining said first current channel;
   a current injector structure having a second current channel formed by a portion of said semiconductor body and connected to said first gate for injecting, in response to a biasing potential applied to said current injector structure, charge carriers into said first gate to forwardly bias this first gate relative to said first current channel; and
   control means connected to said first gate for controlling the conduction of said first current channel,
   the improvement lies in that: said first gate surrounds said first current channel and at least one second gate of said second conductivity type which is electrically floating is formed in said first current channel to be surrounded by the latter so that said first and second gates oppose each other with said first current channel intervening therebetween, thereby developing depletion layers into said first current channel to substantially pinch-off the latter without a biasing potential at said first gate.

2. An integrated semiconductor device according to claim 1, in which:
   said current injector structure is a second transistor comprising an emitter of said second conductivity type, a collector having said second conductivity type and electrically connected to said first gate of said first transistor, and a base comprising a portion of said semiconductor body defined between said emitter and said collector, said base being electrically connected to a source of said first transistor through said semiconductor body.

3. An integrated semiconductor device according to claim 2, in which: said collector is merged in said first gate of said first transistor.

4. An integrated semiconductor device according to claim 1, in which: said first gate is divided into a plurality of portions to define a plurality of first current channels, and a drain of said first transistor and said second gate are provided for each of said current channels.

5. An integrated semiconductor device according to claim 3, in which: said semiconductor body comprises a semiconductor substrate and a semiconductor layer formed on said substrate, and in which: said drain, said first and second gates, and said emitter are provided in the vicinity of an upper surface of said semiconductor layer, respectively, and said source comprises said semiconductor substrate.

6. A three-terminal semiconductor device having first and second current-carrying electrodes and a current-control electrode, comprising:
   at least one current channel of a cylindrical shape for providing at least one current path between said first and second current-carrying electrodes;
   at least one floating gate disposed inside said at least one current channel and establishing a pn junction between this gate and an inner boundary of the current channel; and
   at least one control gate surrounding an outermost boundary of said at least one current channel and establishing a pn junction between this gate and the outermost boundary, said control gate being assigned for receiving a control signal via said control electrode to thereby control current flow in said current channel in accordance with said control signal.

* * * * *